(12) United States Patent
Huttner et al.

(10) Patent No.: US 6,958,282 B1
(45) Date of Patent: Oct. 25, 2005

(54) SOI SEMICONDUCTOR CONFIGURATION AND METHOD OF FABRICATING THE SAME

(75) Inventors: Thomas Huttner, Marktoberdorf (DE); Helmut Wurzer, Dresden (DE); Reinhard Mahnkopf, München (DE)

(73) Assignee: Siemens Aktiengesellschaft, Munich (DE)

( * ) Notice: Subject to any disclaimer, the term of this patent is extended or adjusted under 35 U.S.C. 154(b) by 493 days.

(21) Appl. No.: 09/313,424

(22) Filed: May 17, 1999

(30) Foreign Application Priority Data

May 15, 1998 (DE) .................................. 198 21 999

(51) Int. Cl.$^7$ ............................................. H01L 21/76
(52) U.S. Cl. ...................................... 438/407; 257/347
(58) Field of Search ................................ 438/279, 14.7, 438/168, 225, 211, 249, 282, 298, 412, 407, 438/165, 197, 216, 289, 319, 406, 142, 147, 438/149, 400, 404; 257/E27.112, E21.32, 257/E21.545, E21.561, E21.564, 347–349

(56) References Cited

U.S. PATENT DOCUMENTS

| | | | |
|---|---|---|---|
| 4,774,196 A | | 9/1988 | Blanchard |
| 5,468,657 A | * | 11/1995 | Hsu ............................ 438/766 |
| 5,517,047 A | | 5/1996 | Linn et al. |
| 5,596,218 A | | 1/1997 | Soleimani et al. |
| 5,801,427 A | * | 9/1998 | Shiratake et al. ........... 257/412 |
| 5,893,739 A | * | 4/1999 | Kadosh et al. .............. 438/286 |
| 6,020,232 A | * | 2/2000 | Gardner et al. ............. 438/231 |
| 6,051,452 A | * | 4/2000 | Shigyo et al. .............. 438/151 |
| 6,121,117 A | * | 9/2000 | Sato .......................... 438/459 |

OTHER PUBLICATIONS

Japanese Patent Abstract No. 5-217822, dated Aug. 29, 1993.
Stephan Pindl et al.: "Silicon-on-insulator-Technologie: Neue "Low-Power"-CMOS-Anwendungen mit betriebsspannungen kleiner 0,9 V", Phys. Bl. 54 91998) Nr. 4, pp. 353-355, silicon-on-insulator-technology: new "low-power"-CMOS-applications with an operating voltage of less than 0.9 V.
Japanese Patent Abstract No. 02054532 (Takefumi), dated Feb. 23, 1990.
Japanese Patent Abstract No. 03149821 (Juri), dated Jun. 26, 1991.
Japanese Patent Abstract No. 05047726 (Shinichi), dated Feb. 26, 1993.
Japanese Patent Abstract No. 10163218 (Takashi), dated Jun. 19, 1998.
International Patent Application WO 99/17357 (Biebl), dated Apr. 8, 1999.

* cited by examiner

*Primary Examiner*—Brook Kebede
(74) *Attorney, Agent, or Firm*—Laurence A. Greenberg; Werner H. Stemer; Ralph E. Locher

(57) ABSTRACT

A semiconductor configuration has a base layer made of semiconductor material and formed, in particular, by a substrate. An insulation layer is arranged above the base layer, and a layer made of monocrystalline silicon adjoins the insulation layer. A passivating substance is present, with the formation of Si—X bonds, in the region of the interface between the insulation layer and the monocrystalline silicon layer. The bond energy of the Si—X bond is greater than the bond energy of an Si—H bond.

10 Claims, 5 Drawing Sheets

SOI SEMICONDUCTOR CONFIGURATION AND METHOD OF FABRICATING THE SAME

BACKGROUND OF THE INVENTION

Field of the Invention

The invention lies in the field of semiconductor manufacture. Specifically, the invention relates to a SOI semiconductor configuration, i.e., a structure formed with a base layer (e.g. substrate) of semiconductor material, an insulation layer on the base layer, and a layer of monocrystalline silicon disposed on and adjoining the insulation layer. The invention also pertains to a method of manufacturing the SOI structure.

It has been known in the pertinent art to construct MOS field-effect transistors (MOSFETs) on silicon-on-insulator (SOI) substrates. A significant advantage of the technology is that, in comparison with conventional MOSFETs constructed on silicon substrates, it is possible to achieve complete electrical depletion of the channel during operation. The consequence of this is that very low operating voltages (below 1 V) can be achieved, which, in turn, makes it possible to realize "low-power" CMOS applications with low power consumption. A further beneficial aspect of SOI technology is that very high packing densities can be realized on account of the dual—lateral and vertical—insulation effect of the buried oxide layer. An up-to-date overview over SOI technology and its possible applications in the future is provided in the article "Silicon-on-Insulator-Technologie: Neue 'Low Power'-CMOS Anwendungen mit Betriebsspannungen kleiner 0.9 V" [Silicon-on-Insulator Technology: New 'Low Power' CMOS Applications with Operating Voltages of Less than 0.9 V], Pindl and Risch, Phys. Bl. 54 (1998), No. 4.

It is known in the art that, in conventional MOSFETs constructed on Si substrates, "hot charge carriers" can cause damage to the gate oxide. The "hot charge carriers" thereby rupture Si—H bonds in the interface between the channel silicon and the gate oxide and produce interface states (traps) which are undesirable because they lead to a change in various transistor parameters. The usual procedure for avoiding this so-called HC degradation (HC=hot carrier) is to provide a gentle transition in the drain doping. This measure, known as LDD doping (LDD=Lightly Doped Drain), reduces the production of hot charge carriers and hence damage to the gate oxide. It is disadvantageous, however, that the transistor properties can be adversely influenced by the LDD doping.

SUMMARY OF THE INVENTION

It is accordingly an object of the invention to provide a semiconductor configuration based on SOI technology, which overcomes the above-mentioned disadvantages of the heretofore-known devices and methods of this general type and which makes it possible to form high-performance SOI transistors on it or which already comprises such high-performance SOI transistors. It is a further object of the invention to specify a method for fabricating such a semiconductor configuration.

With the foregoing and other objects in view there is provided, in accordance with the invention, a semiconductor configuration, comprising:
a base layer made of semiconductor material, in particular a substrate;
an insulation layer arranged above the base layer;
a monocrystalline silicon layer disposed above and adjoining the insulation layer, the monocrystalline silicon layer and the insulation layer forming an interface therebetween; and
a passivating substance X forming Si—X bonds at the interface between the insulation layer and the monocrystalline silicon layer, whereby a bond energy of one of the Si—X bonds is greater than a bond energy of an Si—H bond.

The semiconductor configuration according to the invention is thus comparable, in terms of its construction, with a conventional SOI substrate, except for the passivating substance X that is incorporated, with the formation of Si—X bonds, in the region of the interface between the insulation layer and the monocrystalline silicon layer above the latter. Since the Si—X bonds have a greater bond energy than Si—H bonds, it is considerably more difficult for hot charge carriers to rupture them. Therefore, the Si—X bonds remain intact even in the event of comparatively high kinetic charge carrier energies, as a result of which the production of undesirable interface states in the transition region between the insulation layer and the monocrystalline silicon layer is distinctly reduced.

If SOI transistors are formed in the semiconductor configuration according to the invention by means of process steps that will subsequently be described in more detail, the consequence of the incorporation of passivating substance in accordance with the invention is that damage to the SOI insulation layer by hot charge carriers and associated impairment of transistor properties cannot occur, or can occur only to a very small extent.

In accordance with an added feature of the invention, the passivating substance X is a halogen or nitrogen. The halogens, in particular fluorine and chlorine, and also nitrogen form a bond with silicon whose bond energy is distinctly higher than the bond energy of the Si—H bond.

In accordance with an additional feature of the invention, there are provided:
a plurality of laterally adjacent, differently doped regions formed in the monocrystalline silicon layer, the regions forming a source region, a channel region, and a drain region of a MOSFET; and
a gate oxide layer disposed above the channel region and an electrical connection structure forming a gate of the MOSFET disposed on the gate oxide layer.

In this case, the insulation layer creates insulation—which is resistant to HC degradation—of the source, channel and drain region of the SOI MOSFET with respect to the base layer and thus ensures a high transistor drain current.

In accordance with another feature of the invention, the channel region in the monocrystalline silicon layer and the gate oxide layer form an interface therebetween, and the passivating substance X is also present at the interface between the channel region and the gate oxide layer, with a formation of Si—X bonds. Not only the insulation layer but also the gate oxide layer is then passivated, i.e. protected from HC degradation. The concentration of the passivating substance X at the interfaces may be approximately $10^{18}$ cm$^{-3}$ in this case.

In accordance with a further feature of the invention, the semiconductor configuration comprises a plurality of mutually adjacent MOSFETs which isolated from one another by Mesa insulation. The electrical insulation of adjacent MOSFETs can, in principle, be effected by any one of the known technologies, for example LOCOS (Local Oxidation of Silicon) or STI (Shallow Trench Isolation). It is preferable, however, for adjacent MOSFETs to be electrically isolated from one another by Mesa insulation. In this technology, the silicon layer in the region between two SOI MOSFETs is removed down to the underlying insulation layer, in which case high packing densities can advantageously be obtained.

With the above and other objects in view there is also provided, in accordance with the invention, a method of fabricating the semiconductor configuration. The method comprises the following steps:

providing a semiconductor structure having the base layer, the insulation layer, and the monocrystalline silicon layer;

introducing the passivating substance X into one of the insulation layer and the monocrystalline silicon layer during or after the fabrication of the semiconductor structure; and heat-treating the semiconductor structure with the passivating substance X.

In other words, the passivating substance X can be introduced into the insulation layer and/or the monocrystalline silicon layer either during or after the fabrication of the semiconductor structure. The subsequent heat treatment causes the passivating substance X thus introduced to diffuse into the region of the interface, where it replaces existing Si—H bonds with Si—X bonds.

In accordance with a preferred mode of the invention, the passivating substance X is introduced by ion-implantation into the corresponding layer(s). The ion implantation technique enables the passivating substance X to be deposited in a manner allowing a highly targeted dose and with positional accuracy. Furthermore, it is advantageous that the passivating substance X can be introduced into the insulation layer through the upper monocrystalline silicon layer or else, if appropriate, further covering layers as well. Therefore, the introduction of the passivating substance X can chronologically succeed the fabrication of the SOI semiconductor structure, with the result that commercially available prefabricated SOI semiconductor structures can also be used as a basis for the method according to the invention.

The use of an implantation step for introducing the passivating substance X into an SOI semiconductor structure may be advantageous particularly when the SOI semiconductor structure is also fabricated by means of an ion implantation process. This is the case with the so-called SIMOX (Separation by Implementation of Oxygen) technology, in which the insulation layer is formed in the form of a buried $SiO_2$ layer by implantation of a high oxygen dose into a monocrystalline silicon substrate. The implantation step for introducing the passivating substance X can then directly follow the oxygen implantation step for forming the SOI semiconductor structure, and, in a manner which is beneficial in terms of fabrication engineering, the two steps can be carried out in one and the same implantation installation. Furthermore, it is also possible to perform the passivating substance implantation step according to the invention prior to the oxygen implantation.

A further possibility is to introduce the passivating substance X into the SOI semiconductor structure by means of a diffusion step. A suitable fabrication method for this purpose, for SOI semiconductor structures, is known in the art as a BESOI (Bonded Etched-back Silicon on Insulator) method. In this method, two silicon semiconductor substrates are firstly provided in each case with a surface oxide layer. The two silicon semiconductor substrates are then joined by contact-connection of their oxide layers and one of the silicon semiconductor substrates is removed, except for a thin residual layer, for the purpose of forming the upper monocrystalline silicon layer. In accordance with a design variant according to the invention, the BESOI method is now modified such that the passivating substance X is introduced into one or both oxide layers before the joining of the two silicon semiconductor substrates and/or into one of the silicon semiconductor substrates before or after the oxidation step. In this case, the introduction of the passivating substance X can be performed simply by thermal doping (diffusion of the passivating substance from a passivating substance gas into the corresponding layer), since the layers to be passivated are uncovered before the joining of the two silicon semiconductor substrates.

In order to obtain short diffusion paths in the heat-treatment step which is to be carried out after the introduction of the passivating substance X, it is expedient for the implantation maximum of the passivating substance X to be placed in the vicinity of the interface with the monocrystalline silicon layer.

A covering oxide layer is preferably applied on the top monocrystalline silicon layer. The covering oxide layer may serve as a screen layer in subsequent implantation steps.

The introduction of the passivating substance X into the insulation layer and/or the monocrystalline silicon layer can be performed either before or after any patterning of the monocrystalline silicon layer that is to be carried out. One advantage of the last-mentioned possibility is that the passivating substance X, when being introduced into the insulation layer and/or the silicon layer, can simultaneously be incorporated into so-called spacers which have been formed beforehand on steps of the patterned monocrystalline silicon layer. In this way, the spacers are passivated as well, as a result of which the formation of undesirable Mesa sidewall transistors can be effectively suppressed.

Other features which are considered as characteristic for the invention are set forth in the appended claims.

Although the invention is illustrated and described herein as embodied in an SOI semiconductor configuration and method for fabricating the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
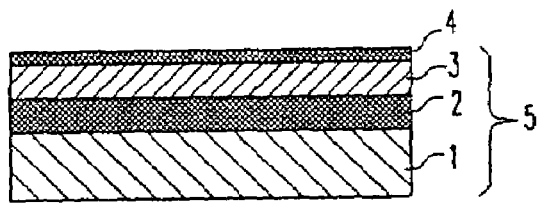
FIGS. 1a to 1f are diagrammatic vertical sectional views of a sequence with a first design variant, in which the passivating substance X is introduced prior to the patterning of the silicon layer by implantation into a buried oxide layer.

Referring now to the figures of the drawing in detail and first, particularly, to FIGS. 1a to 1f thereof, there is seen an SOI semiconductor structure 5 that comprises an Si base layer 1, which is formed by an Si substrate and is adjoined by a buried oxide layer 2, on which a monocrystalline silicon layer 3 is overlaid. By way of example, the SOI semiconductor structure 5 may be fabricated according to the SIMOX or BESOI technologies and is commercially available as a finished product. Furthermore, the Si base layer 1 and the monocrystalline silicon layer 3 may already be p- or n-predoped by the manufacturer.

With reference to FIG. 1a, a screen oxide layer 4 is first formed on the SOI semiconductor structure 5. The screen oxide layer 4 may be formed for example by thermal oxidation of the monocrystalline silicon layer 3 or by deposition of a TEOS (tetraethylorthosilicate) layer by means of a CVD process.

Figure 1B:
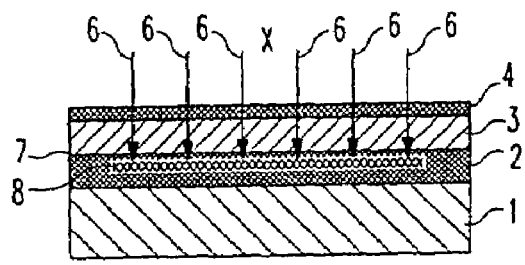

With reference to FIG. 1b, the passivating substance X is subsequently incorporated in a whole-area or large-area application by implantation into the buried oxide layer 2. The implantation step is illustrated by arrows 6. By way of example, nitrogen, fluorine or chlorine is used as the passivating substance X. The incorporation process can be controlled in a highly targeted manner with regard to the incorporation depth, the incorporation dose and the incorporation profile. Since the passivating substance X is intended to be employed in the region of the interface 7 between the monocrystalline silicon layer 3 and the buried oxide layer 2, conditions which cause the implantation maximum 8 to lie a short way underneath the interface 7 are chosen in the implantation step.

Figure 1C:
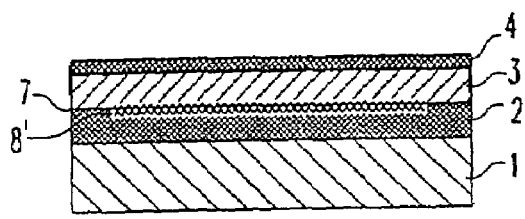

A heat-treatment step is subsequently carried out. In the process, the passivating substance X implanted into the buried oxide layer 2 diffuses to the interface 7, the passivating substance distribution 8' also being shifted into the region of the interface 7. In the process, Si—H bonds present in the region of the interface 7 are replaced by the more energy-stable Si—X bonds. As a result, the damage resistance of the buried oxide layer 2 with respect to HC degradation is increased in the manner already described. Furthermore, the heat-treatment step effects annealing of damage or defects which have occurred during the implantation step in the upper layers 3 and 4. FIG. 1c illustrates the situation after the heat-treatment step has been carried out. The concentration of the passivating substance X may be approximately $10^{18}$ cm$^{-3}$, for example.

Figure 1D:
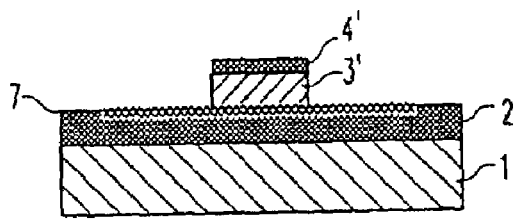
Figure 1E:
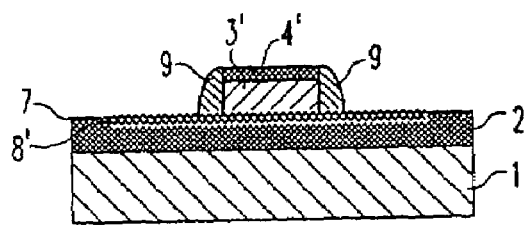
Figure 1F:
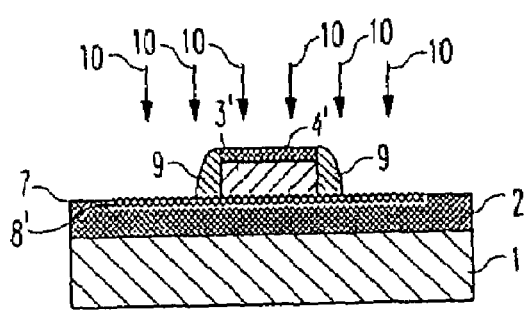

FIGS. 1d to 1f show, by way of example, further process steps which are carried out for the patterning and insulation of the monocrystalline silicon layer 3 for the purpose of forming an SOI MOSFET. Such steps are also necessary to construct an integrated CMOS circuit on the SOI semiconductor structure 5. First of all, in accordance with FIG. 1d, the screen oxide layer 4 and the monocrystalline silicon layer 3 are removed, except for locally residual layer regions 3', 4', using customary photolithographic masking techniques and etching steps. As a result, the monocrystalline layer region 3' is electrically insulated from corresponding, adjacent layer regions (not illustrated in FIG. 1d). The method shown here is known as Mesa insulation in the art. Other insulation methods (for example LOCOS, STI) can also be employed instead of Mesa insulation.

According to FIG. 1e, the peripheral walls of the layer regions 3', 4' are covered with spacers 9 The spacers 9 serve to additionally insulate the peripheral walls of the freestanding layer regions 3', 4'.

Finally, according to FIG. 1f, the channel doping of the SOI MOSFET to be produced is brought about by a further implantation step. The channel implantation step is indicated by the arrows 10.

The implantation steps (FIG. 1b, FIG. 1f) can be carried out in a positionally selective manner by using non-illustrated implantation masks. In particular, the passivating substance X can be implanted in a targeted manner for example only into n-channel transistors.

The second method variant illustrated in FIGS. 2a to 2f differs from the first method variant shown in FIGS. 1a to 1f essentially merely in the fact that the implantation maximum 8 lies in the monocrystalline silicon layer 3 rather than in the buried oxide layer 2. In this case, the implanted dose of the passivating substance X should lie below the amorphizing dose in silicon. According to FIG. 2c, in this variant the implanted passivating substance X diffuses both to the interface 7 between buried oxide layer 2 and monocrystalline silicon layer 3 and to an interface 11 between monocrystalline silicon layer 3 and screen oxide layer 4. As a result, after removal of the screen oxide layer 4 and subsequent growth of a gate oxide layer on the monocrystalline silicon layer 3, the latter still contains sufficient passivating substance X in the region near the interface to increase the resistance of the gate oxide layer as well with respect to damage caused by hot charge carriers.

Figure 2A:
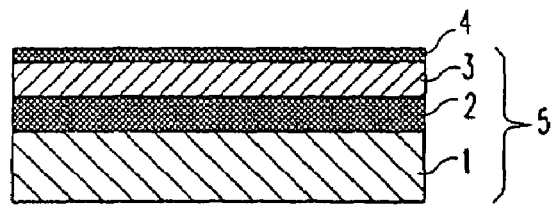
FIGS. 2a to 2f are diagrammatic vertical sectional views of a sequence with a second design variant, in which the passivating substance X is introduced prior to the patterning of the silicon layer by implantation into the silicon layer.
Figure 2B:
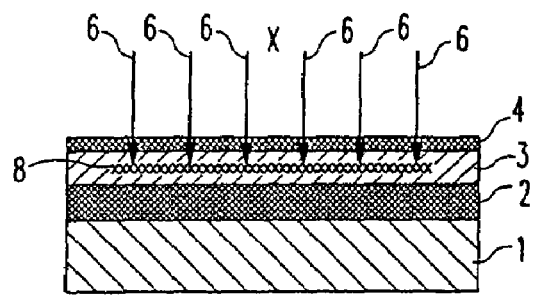
Figure 2C:
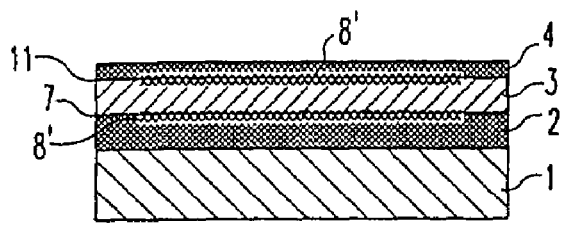
Figure 2D:
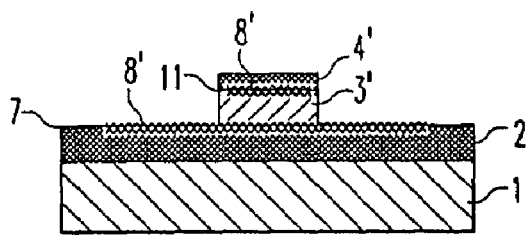
Figure 2E:
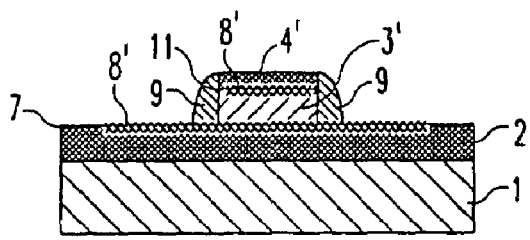
Figure 2F:
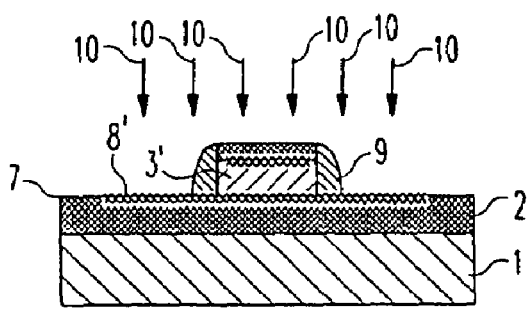

The steps of patterning/insulation, spacer formation and channel implantation as illustrated in FIGS. 2d to 2f are carried out analogously to the steps illustrated in FIGS. 1d to 1f.

The heat-treatment step shown in FIG. 2c may also be carried out after the Mesa insulation (FIG. 2d) and the provision of the spacers 9 (FIG. 2e). In that case, the passivating substance X is situated only in those portions of the interfaces 7, 11 which are covered by the layer regions 3', 4', i.e. in the active regions. When spacers 9 made of silicon oxide and a nitrogen passivating substance X are used, the spacer inner walls adjoining the peripheral walls of the layer regions 3', 4' are also nitrided in this case. During the subsequent channel doping (FIG. 2f) this inhibits the outdiffusion of channel dopant into the spacers and consequently suppresses the formation of Mesa sidewall transistors in a desired manner.

Halogens used as passivating substance X, on the other hand, accelerate the diffusion of channel dopant, in particular boron, into spacers 9 formed from silicon oxide. In order to avoid sidewall transistors, Mesa spacers 9 formed from silicon nitride are used in this case.

Figure 3A:
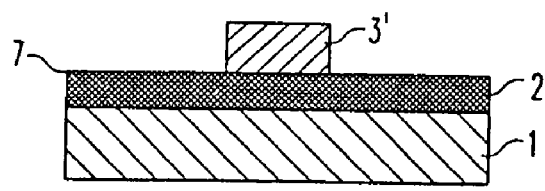
FIGS. 3a to 3f are diagrammatic vertical sectional views of a sequence with a third design variant of the invention, in which the passivating substance X is introduced after the patterning of the silicon layer by implantation into a buried oxide layer.
Figure 3B:
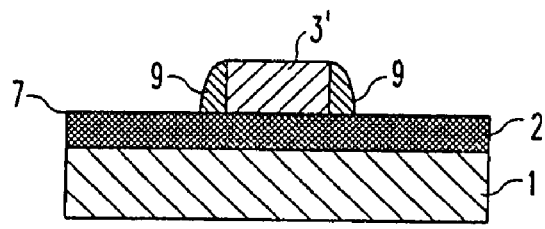
Figure 3C:
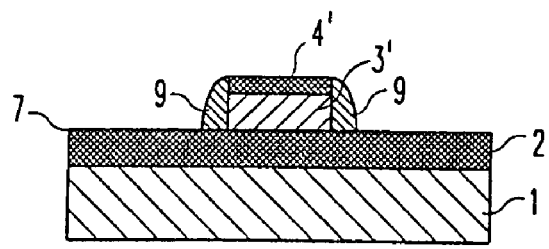
Figure 3D:
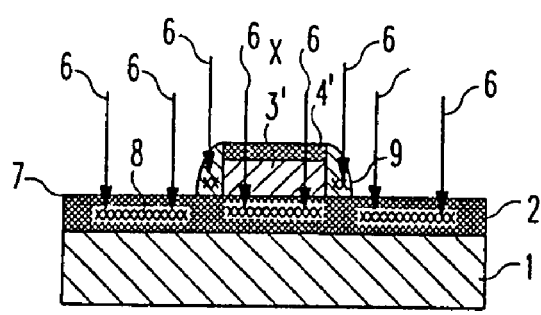

In the case of the third design variant of the method according to the invention as illustrated in FIGS. 3a to 3f, the passivating substance X is introduced into the buried oxide layer 2 as in the case of the first design variant (FIGS. 1a to f). The corresponding implantation step is illustrated in FIG. 3d. In contrast to the first design variant, however, the patterning/insulation and also the formation of the Mesa spacers 9 and subsequent thermal oxidation of the monocrystalline layer region 3' for the purpose of forming the screen layer region 4' (see FIGS. 3a to 3c) eventually take place prior to the passivating substance implantation step in this case.

Figure 3E:
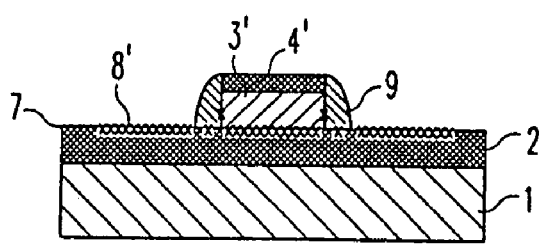
Figure 3F:
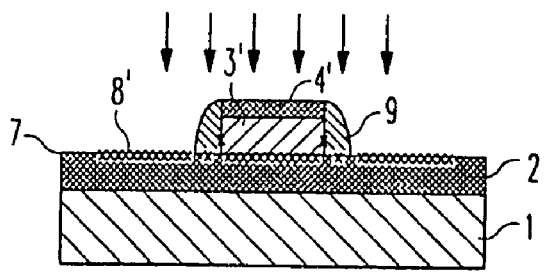

If the spacers 9 are composed of silicon oxide, the consequence of this is that the passivating substance X is also implanted into the Mesa spacers 9, since the implantation depth is smaller in silicon oxide than in monocrystalline silicon. As a result, the suppressing—which was described in the case of the second design variant—of Mesa sidewall transistors in the event of using nitrogen as passivating substance X takes place in this case as well. FIG. 3e shows the nitrogen distribution 8' resulting after the heat-treatment step in the region of the interface 7 and at the peripheral walls of the monocrystalline layer region 3'. In the event of using halogens as passivating substance, spacers 9 composed of silicon nitride should be used—as already described in connection with the second design variant.

FIG. 3f again shows the channel implantation step.

If the heat-treatment step illustrated in FIG. 3e is not carried out until after the channel implantation (FIG. 3f), the well photomask (not illustrated) used for the channel implantation can be used to mask the implantation of the passivating substance X as well, with no additional outlay. In this procedure, too, the passivating substance X is implanted into the Mesa spacers 9, provided that the latter are composed of silicon oxide.

Figure 4A:
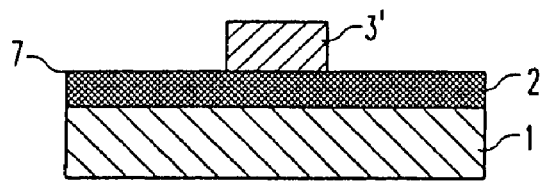
FIGS. 4a to 4f are diagrammatic vertical sectional views of a sequence with a fourth design variant of the invention, in which the passivating substance X is introduced after the patterning of the silicon layer by implantation into the silicon layer.
Figure 4B:
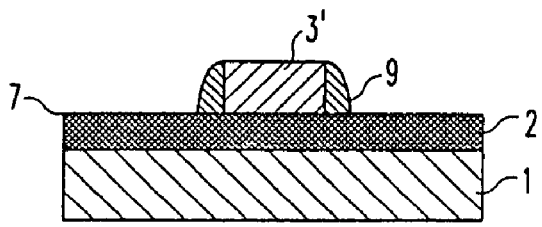
Figure 4C:
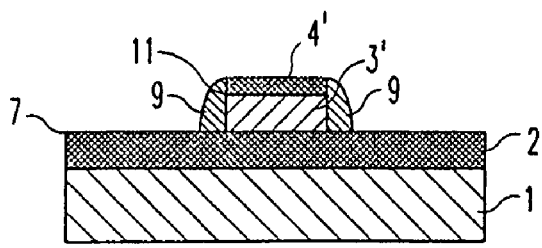
Figure 4D:
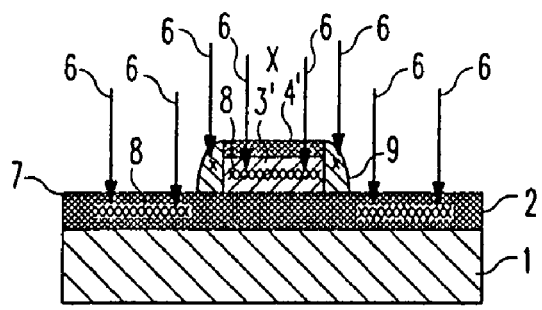
Figure 4E:
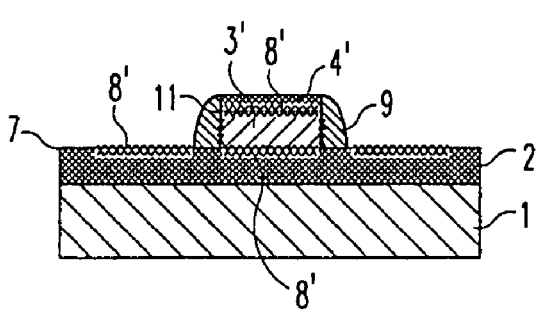

FIGS. 4a to 4f show a fourth design variant of the method according to the invention. In this case, as in the case of the third design variant, the patterning/insulation, the Mesa spacer formation and the thermal oxidation of the active silicon layer region 3' (FIGS. 4a to 4c) take place before the introduction of the passivating substance X by an implantation step (FIG. 4d). In contrast to the third design variant, a lower implantation energy is chosen in this case, with the result that the implantation maximum 8 lies within the monocrystalline Si layer region 3'. Implantation into the spacers 9 takes place in this case as well. FIG. 4e shows the distribution 8' of the passivating substance X after the heat-treatment step. The advantage of this design variant resides in the additional passivation (halogenation or nitriding) of the gate oxide to be grown on later (cf. the second design variant as well) and—given the use of nitrogen implantation and oxide spacers 9–in the nitriding of the Mesa spacer inner side for the purpose of suppressing Mesa sidewall transistors. FIG. 4e shows that the active monocrystalline silicon layer region 3' is completely passivated on all sides.

Figure 4F:
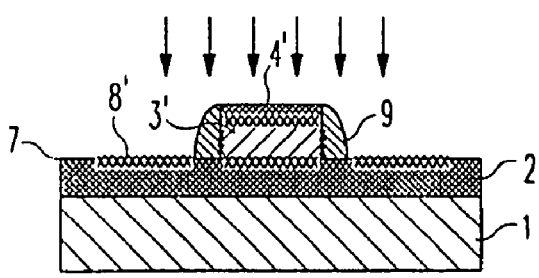

If halogens are used as the passivating substance X, spacers 9 made of silicon nitride should again be used. In addition, as in the case of the third design variant, it is possible, during the masking of the passivating substance implantation step (FIG. 4d), to use the same mask as for the channel implantation step (FIG. 4f).

Figures 5A, 5B, 5C, 5D, 5E:
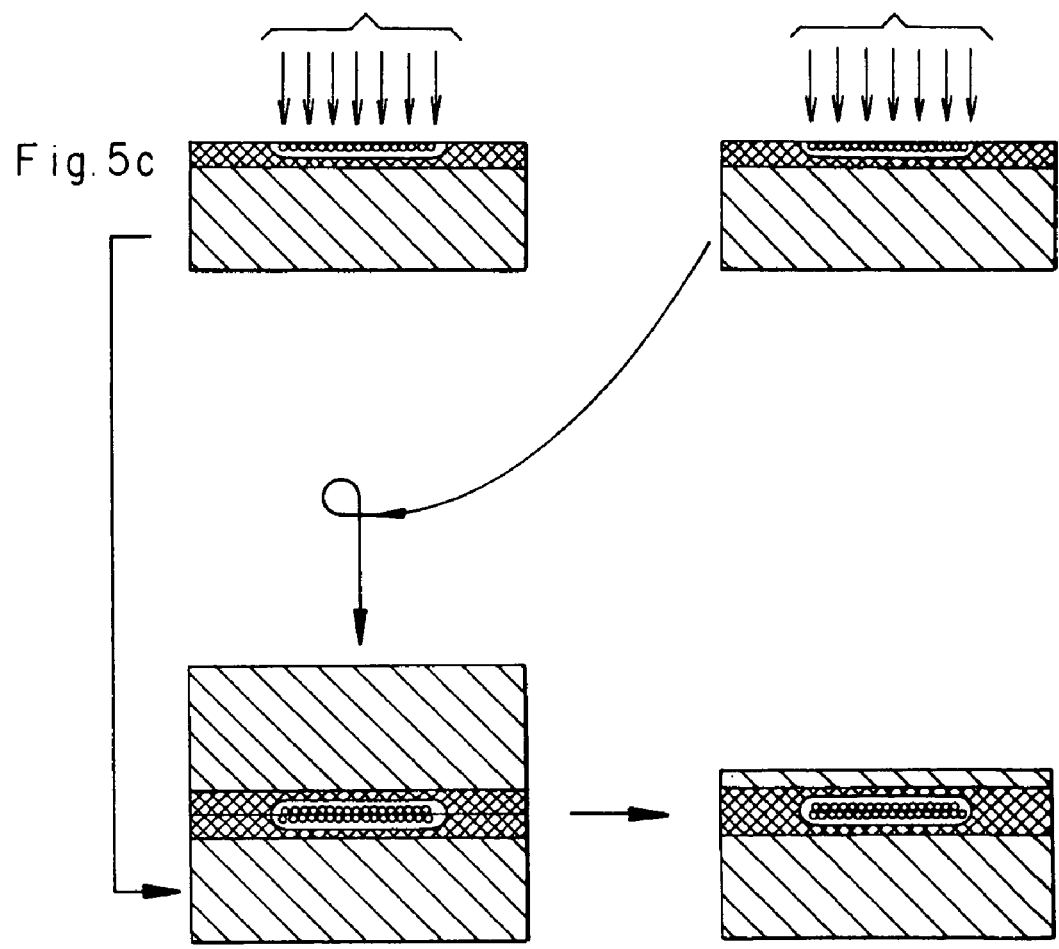
FIGS. 5a to 5e are diagrammatic vertical sectional views of a BESOI sequence in which a passivating substance X is introduced before the joining of two silicon layer.

A further possibility is to introduce the passivating substance X into the SOI semiconductor structure through the use of a diffusion step, which is illustrated in FIGS. 5a–5e. A suitable fabrication method for this purpose, for SOI semiconductor structures, is known in the art as a BESOI (Bonded Etched-back Silicon on Insulator) method. In this method, two silicon semiconductor substrates are firstly provided (FIG. 5a). A surface oxide layer is then formed on each one of the two silicon semiconductor substrates (FIG. 5b). A passivating substance X is introduced into at least one of the oxide layers before or after an oxidation step performed on one of the silicon semiconductor substrates (FIG. 5c). The two silicon semiconductor substrates are then joined by contacting the two oxide layers (FIG. 5d) and one of the silicon semiconductor substrates is partially removed for forming the monocrystalline silicon layer (FIG. 5e).

The table below shows the bond energies of silicon with hydrogen and also the passivating substances nitrogen, fluorine and chlorine. It is evident that the Si—X bond has a distinctly higher bond energy when the above-mentioned passivating substances X are used than when hydrogen is used as the bonding partner.

TABLE

Bond energies of silicon bonds

| Bond | Bond Energy [eV] |
| --- | --- |
| Si—H | 3.1 |
| Si—N | 4.6 |
| Si—F | 5.7 |
| Si—Cl | 4.7 |

We claim:

1. A method of fabricating a semiconductor configuration, which comprises the following steps:
    fabricating a semiconductor structure having a base layer, an insulation layer, a monocrystalline silicon layer, and an interface between the insulation layer and the monocrystalline silicon layer;
    placing a passivating substance X into the monocrystalline silicon layer, during or after the fabrication of the semiconductor structure; and
    heat-treating the semiconductor structure with the passivating substance X for causing the passivating substance X in the monocrystalline silicon layer to diffuse both to the interface and to a surface of the monocrystalline silicon layer opposite to the interface.

2. The method according to claim 1, wherein the introducing step comprises ion-implanting the passivating substance X.

3. The method according to claim 2, wherein the introducing step is performed such that there is an implantation concentration maximum for the passivating substance X in the vicinity of the interface.

4. The method according to claim 1, wherein the fabricating of the semiconductor structure comprises the following steps:
    providing two silicon semiconductor substrates;
    oxidizing and forming a respective oxide layer on the two silicon semiconductor substrates;
    joining the two silicon semiconductor substrates by contacting the two oxide layers; and
    partially removing one of the silicon semiconductor substrates and forming the monocrystalline silicon layer.

5. The method according to claim 1, which comprises forming a covering oxide layer on the monocrystalline silicon layer.

6. The method according to claim 1, which comprises patterning the monocrystalline silicon layer by etching away regions thereof down to the underlying insulation layer.

7. The method according to claim 6, wherein the patterning step is performed before the step of introducing the passivating substance X into one of an insulation layer and the monocrystalline silicon layer.

8. The method according to claim 6, wherein the patterning step is performed after the step of introducing the passivating substance X into one of the insulation layer and the monocrystalline silicon layer.

9. The method according to claim 1, which comprises:
doping the monocrystalline silicon layer differently region by region by ion implantation; and
performing the doping step after the step of introducing the passivating substance X and the heat-treating step.

10. The method according to claim 6, wherein the step of introducing a passivating substance X into the monocrystalline silicon layer is performed such that an implanted dose of the passivating substance X is below an amorphizing dose of silicon.

* * * * *